(12) United States Patent
Boufnichel et al.

(10) Patent No.: US 7,226,870 B2
(45) Date of Patent: Jun. 5, 2007

(54) FORMING OF OBLIQUE TRENCHES

(75) Inventors: Mohamed Boufnichel, Tours (FR); Laurent Bellieres, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/138,804

(22) Filed: May 26, 2005

(65) Prior Publication Data

US 2005/0263486 A1   Dec. 1, 2005

(30) Foreign Application Priority Data

May 26, 2004   (FR)   ................................. 04 51038

(51) Int. Cl.
   *H01L 21/302*   (2006.01)
(52) U.S. Cl. ............... 438/710; 438/700; 257/E21.214; 257/E21.218
(58) Field of Classification Search ................ 438/706, 438/710, 729, 474, 700; 257/E21.214, E21.218
   See application file for complete search history.

(56) References Cited

U.S. PATENT DOCUMENTS

| | | | | |
|---|---|---|---|---|
| 5,289,077 | A * | 2/1994 | Ugajin | 313/308 |
| 6,316,169 | B1 * | 11/2001 | Vahedi et al. | 430/329 |
| 7,018,780 | B2 * | 3/2006 | Vahedi et al. | 430/314 |
| 2002/0006704 | A1 * | 1/2002 | Tseng et al. | 438/270 |
| 2002/0158247 | A1 * | 10/2002 | Mahanpour et al. | 257/48 |
| 2004/0100680 | A1 * | 5/2004 | Huibers et al. | 359/291 |

FOREIGN PATENT DOCUMENTS

EP   0 070 692 A2   1/1983

OTHER PUBLICATIONS

French Search Report fron French Patent Application No. 04/51038, filed May 26, 2004.
Patent Abstracts of Japan, vol. 2002, No. 09, Sep. 4, 2002 & JP 2002 134470 A (Semiconductor Leading Edge Technologies, Inc.),May 10, 2002.
Patent Abstracts of Japan, vol. 005, No. 113 (E-066), Jul. 22, 1981 & JP 56 054066 A (Toshiba Corp.) May 13, 1981.
Patent Abstracts of Japan, vol. 015, No. 514 (E-1150), Dec. 27, 1991 & JP 03 225961 A (Meidensha Corp), Oct. 4, 1991.
Patent Abstracts of Japan, vol. 1996, No. 09, Sep. 30, 1996 & JP 08 130220 A (NKK Corp.), May 21, 1996.
Patent Abstracts of Japan, vol. 012, No. 013 (E-573), Jan. 14, 1988 & JP 62 173737 A (Mitsubishi Electric Corp), Jul. 30, 1987.
Patent Abstracts of Japan, vol. 014, No. 067 (E-0885), Feb. 7, 1990 & JP 01 286436 A (Fujitsu Ltd.), Nov. 17, 1989.

* cited by examiner

*Primary Examiner*—Michelle Estrada
*Assistant Examiner*—Jarrett J. Stark
(74) *Attorney, Agent, or Firm*—Lisa K. Jorgenson; James H. Morris; Wolf, Greenfield & Sacks, P.C.

(57) ABSTRACT

A method for forming an oblique recess of minimum dimension smaller than 10 μm in a wafer arranged in a plasma etch reactor in which the plasma extends along the wafer surface, including forming discontinuities in the contour of the plasma and of its sheath in the immediate vicinity of the wafer in areas where recesses delimited by openings in a protection mask are desired to be formed at the wafer surface.

12 Claims, 2 Drawing Sheets

FORMING OF OBLIQUE TRENCHES

BACKGROUND OF THE INVENTION

1. Field of the Invention

The present invention relates to the forming of recesses, bores, or trenches in a material, and especially applies to the field of semiconductor materials, intended for the forming of discrete or integrated components.

The present invention more specifically relates to the forming of recesses, bores, or trenches which are oblique with respect to a main surface of the material to be etched and have a small transverse dimension.

2. Discussion of the Related Art

When recesses are desired to be etched according to a pattern having at least one very small dimension (smaller than 10 µm and possibly smaller than 1 µm) into the surface of a material, one of the currently-used methods, especially in the field of microelectronics, is a plasma etch method.

FIG. 1 very schematically shows a plasma etch reactor. The reactor comprises an enclosure 1 provided with a bottom 2 on which is placed a support or susceptor 3, that may be isolated from bottom 2. A wafer 4 in which etch operations are desired to be performed is placed on support 3. A plasma 5 is created by any means in the enclosure, for example, by a radio frequency field, and may be confined by electromagnetic fields. Of course, the enclosure further comprises means, not shown, of gas introduction, circulation, and extraction, and possibly means for imposing a temperature, for example, for cooling down, to support 3, as well as means for biasing this support. As schematically illustrated in FIG. 1, the plasma generally extends into the entire enclosure, and by all means in the vicinity of wafer 4 to be etched, and is separated from all the internal enclosure surfaces by a distance s, in which a neutral area, called a sheath, is present. In the case where wafer 4 is a silicon wafer, plasmas are often obtained from fluorinated or chlorinated gases.

Generally, anisotropic plasma etch methods involve two mechanisms: an etch mechanism and a passivation mechanism that may be alternated or not. The etch mechanism is considered as involving two phenomena, on the one hand a bombarding by the ions present in the plasma, on the other hand a chemical etch by reactive substances present in the plasma. The two phenomena are indissociable. The ion bombarding is used to eliminate the reaction products arranged at the bottom of a recess being formed.

These explanations have been given to expose the context of the present invention, given that plasma etch methods are well known per se and that there exist many variations thereof that can be found in specialized works.

FIG. 2 is a cross-section view of a wafer 4, coated with a masking layer 7 comprising openings 8, arranged in the plasma etch reactor of FIG. 1, that is, it shows a plasma region 5 separated from the wafer by a sheath thickness s.

The ions bombard the silicon wafer perpendicularly to the surface thereof and are active, with chemical species located in the plasma, at the level of openings 8 in mask 7 to etch in wafer 4 recesses 10 orthogonal to the wafer surface.

Thus, anisotropic plasma etch techniques do normally not enable forming recesses which are not orthogonal to a main surface of a wafer to be processed.

Japanese patent application 2002-134470 suggests to deviate ions due to a lateral field created at the surface of a wafer. This field results from a charge accumulation under insulating layers having different thicknesses, the thickness difference being of about 100 nm. This method is not adapted to provide deep trenches nor substantial inclination angles.

So, if oblique recesses or trenches are desired to be formed, techniques other than plasma etching are used. An oblique trench will for example be formed by sawing with diamond saws (JP-A-56054066), by sand blasting (JP-A-03225961), or with a laser (EP-A-0070692), or also by slanted ionic etching (JP-A-08130220 and JP-A-62173737). The methods do not provide thin trenches or enable forming patterns of complex shapes.

SUMMARY OF THE INVENTION

The present invention provides a modification of usual plasma etch methods to enable obtaining recesses, trenches, or vias, extending obliquely with respect to the surface of a wafer and not only perpendicularly thereto, these recesses being likely to have small lateral dimensions, such as conventionally obtained by plasma etch.

More specifically, the present invention provides a method for forming an oblique recess of minimum dimension smaller than 10 µm in a wafer arranged in a plasma etch reactor in which the plasma extends along the surface of the wafer, comprising forming discontinuities in the contour of the plasma and of its sheath in the immediate vicinity of the wafer in areas where recesses delimited by openings in a protection mask are desired to be formed at the wafer surface. The discontinuities result, for example, from protrusions formed on the wafer.

DETAILED DESCRIPTION

Figure 1:
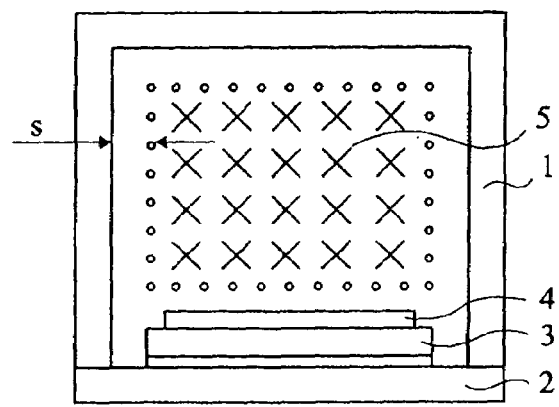
FIG. 1 very schematically shows a plasma etch reactor.
Figure 2:
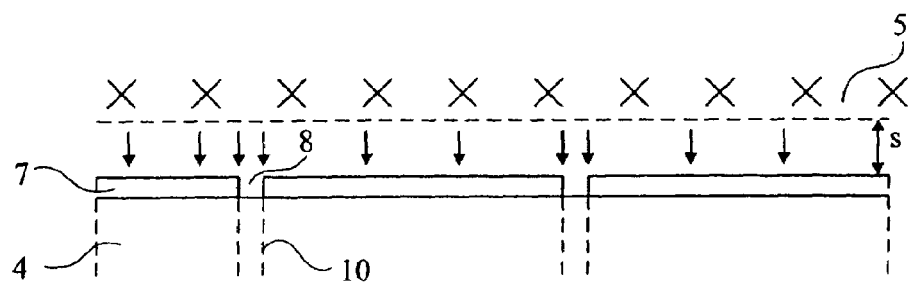
FIG. 2 is a cross-section view of a wafer conventionally etched by plasma.

For clarity, the same elements have been designated with the same reference numerals in the different drawings and, as usual in the representation of semiconductor components, the various drawings are not drawn to scale.

The present invention is based on the observation according to which, in a conventional plasma etch, the etching is of course orthogonal to the surface of the wafer to be etched, but above all occurs perpendicularly to the plasma surface at the sheath limit.

Thus, the present invention provides deforming the plasma contour so that ions, projected orthogonally to this contour, will be projected in a direction which is not parallel to the wafer surface.

According to an embodiment of the present invention, this plasma contour deformation is performed by forming protrusions on the wafer surface. However, other means may be envisaged to deform this plasma contour.

Figure 3:
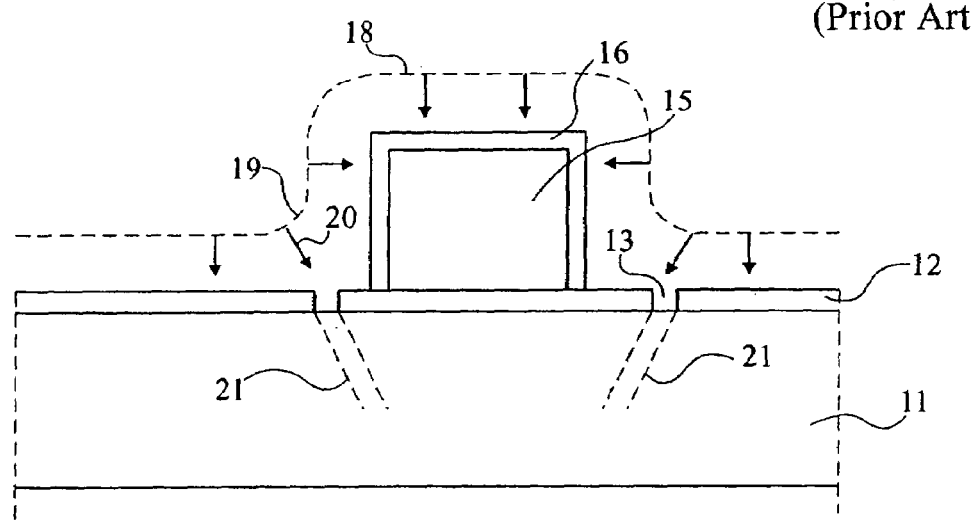
FIG. 3 is a cross-section view of a wafer etched by plasma according to a first embodiment of the present invention.

FIG. 3 illustrates an embodiment of the present invention. On a silicon wafer 11 to be processed is formed a mask 12 provided with openings 13. In the vicinity of at least one of these openings, a protrusion 15 is formed on the wafer. This protrusion may be formed by deposition and etch of a thick layer and its surface will possibly be coated with a coating 16 to make it insensitive to the plasma etch.

The plasma contour deforms in the vicinity of the protrusion, as indicated by curve 18 in dotted lines, and especially comprises a rounded area 19 in the vicinity of the protrusion base. In the curvature area, the ion bombarding paths 20 are orthogonal to this curvature, that is, are oblique with respect to the surface of wafer 11. Oblique recesses 21 can thus be formed in the wafer. The inclination of recesses 21 depends on the proximity of openings 13 in mask 12 with respect to the base of protrusion 15. The closer openings 13 in mask 12 are to the base of protrusion 15, the more oblique the recesses will be.

Figure 4:
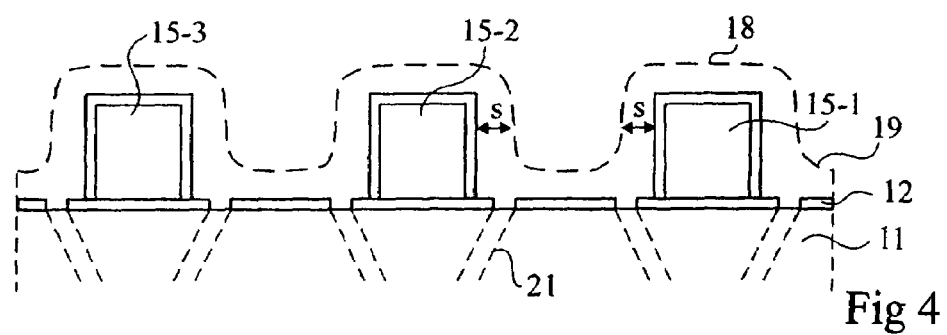
FIG. 4 is a cross-section view of a plasma-etched wafer according to a second embodiment of the present invention.

As shown in FIG. 4, in which the same elements have been designated with the same reference numerals as in FIG. 3, several protrusions 15.1, 15.2, 15.3 may be created at the wafer surface and various oblique recesses may be created at the bases of these protrusions, on one side and/or on the other of each protrusion, which enables orienting the recesses in different directions.

The distance between protrusions 15.1 and 15.2 is sufficient for the sheath to be deformed and for the plasma to penetrate more or less deeply between the protrusions, that is, the distance between two protrusions must be greater than sheath thickness s.

In practice, the sheath thickness currently has, according to the plasma conditions, a value of from 0.1 to 0.6 mm. These values are given as an example only and will depend on the plasma conditions in the reactor as well as on the reactor type. Especially, sheath thickness s is increased by increasing the pressure in the enclosure. So, to obtain a substantial deformation of the sheath shape, the protrusions should have a height of at least 100 µm, preferentially of the same thickness range as the thickness s of the sheath.

All alternative plasma etches may be used, especially various substrate biasing systems and various possible substrate cooling systems as well as various systems for circulating the gases in the enclosure.

Many means may be used to form the structure comprising the protrusions. In the case where the substrate to be etched is a silicon wafer, this wafer may first be coated with a mask, after which a second silicon wafer provided with bores around protrusions 15 of FIGS. 3 and 4 may be laid on the first wafer. The apparent surfaces of the second wafer will preferably be oxidized to avoid an etching of the silicon by the plasma. Several second wafers comprising selected patterns may, if several trenches close to one another and/or of different orientations are desired to be formed in the wafer to be etched, be successively used.

Generally, the present invention has the advantage of enabling forming in a wafer oblique recesses, vias, or trenches of a width much smaller than 10 µm, which is much smaller than the minimum dimension which can currently be achieved by using saws. Especially, in the field of plasma etch, recesses having minimum dimensions much smaller than one micrometer, but that can reach a few micrometers, can currently be etched, and the depth of the formed recesses can extend down to depths on the order of a few micrometers, but reaching a few hundreds of micrometers.

It should thus be understood that the present invention provides many applications in various fields and especially in the field of microelectronics.

Protrusions 15 may take the shape of rectilinear ribs if rectilinear-trench shaped recesses 21 are desired to be formed. Protrusions 15 may also take the shape of pins, circular or having any other selected shape, centered on corresponding openings 13 formed in mask 12; recesses 21 will then have the shape of inverted tapers.

Figure 5:
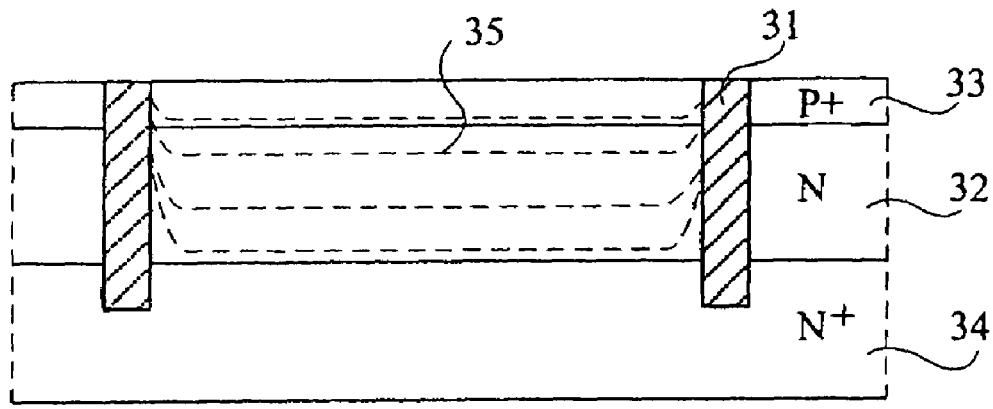
FIG. 5 shows a conventionally-formed trench-isolation diode.
Figure 6:
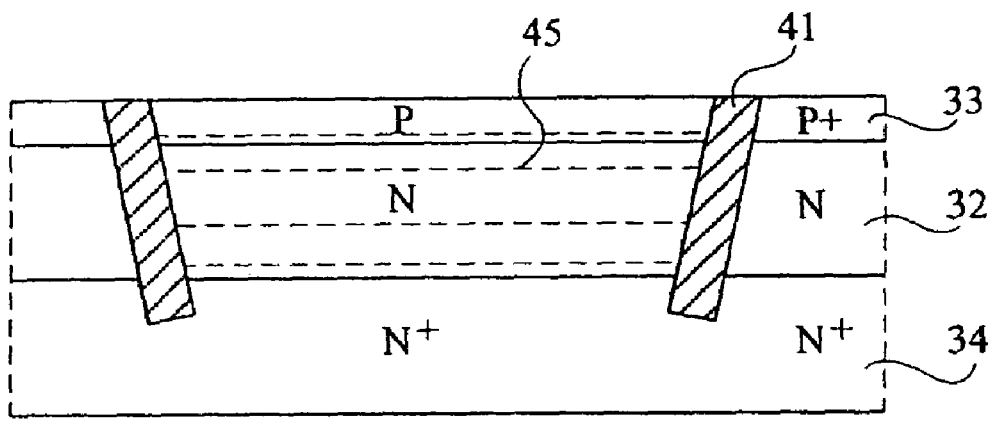
FIG. 6 shows a trench-isolation diode formed according to the present invention.

FIGS. 5 and 6 illustrate an example of application of the present invention to the forming of a vertical high-voltage diode, FIG. 5 illustrating a conventional structure and FIG. 6 illustrating a structure according to the present invention. The diode is formed from a lightly-doped N-type substrate 32 having its upper surface comprising a P-type doped region 33 and having its lower surface comprising a heavily-doped N-type region 34. An active area is delimited by a trench 31 having its walls coated with an insulator, for example, silicon oxide. Trench 31 crosses P layer 33 and, at least partially, substrate 32. A cathode metallization, not shown, is formed on the lower surface and an anode metallization, not shown, is formed on the upper surface on the active area.

One of the important features of high-voltage diodes is that they must stand a significant reverse voltage. This voltage is essentially supported by lightly-doped substrate 32. The equipotential surfaces, shown in dotted lines, extend substantially horizontally and distribute mainly in layer 32. However, in the conventional case illustrated in FIG. 5, a curvature of equipotential surfaces 35 at the level of their periphery can be observed. Thus, the equipotential surfaces are closer to one another at the level of the component periphery, in the vicinity of vertical trench 31, than in the central portion. The thickness of N-type layer 32 must thus be greater than its theoretical thickness to enable standing the voltage with no breakdown at the level of the component periphery.

If, as illustrated in FIG. 6, instead of a vertical trench such as trench 31, an oblique trench 41 according to the present invention is used, equipotential surfaces 36 become horizontal even in the peripheral region. The diode will have a higher breakdown voltage and the thickness selected for the lightly-doped N-type region will be able to be closer to its theoretical value. As indicated previously, the peripheral oblique trench may be formed in one or several steps. It may also be formed of a succession of close bores (as pinholes) joining after an oxidization step.

More generally, a trench may be formed by providing a series of recesses close to one another, the intervals between recesses being specifically processed, for example, by forming from these recesses specifically diffused and/or oxidized regions joining from one recess to the adjacent recess.

This is an example only of application of the present invention. Many other examples will occur to those skilled in the art. For example, strongly oblique trenches joining inside of the substrate may be used to delimit isolated areas in the substrate. Oblique vias may also be formed to solve topological connection problems.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of forming a vertical high-voltage diode, comprising:

providing a wafer comprising a substrate with an upper surface, the wafer having doped regions and protrusions on the upper surface;

forming first and second oblique trenches that cross the upper surface and at least partially penetrate the substrate;

wherein forming the first and second oblique trenches comprises plasma etching the wafer in areas close to the protrusions.

2. The method of claim 1, further comprising placing a mask over the upper surface before plasma etching, the mask including openings where the trenches are to be formed.

3. The method of claim 2, wherein forming the trenches comprises forming a plurality of recesses with plasma etching and oxidizing regions between the recesses to form continuous trenches.

4. The method of claim 1, wherein forming the trenches comprises forming trenches having sectional dimensions smaller than 10 μm.

5. The method of claim 1, wherein providing a wafer having protrusions on the upper surface comprises forming protrusions of a height greater that 100 μm on the upper surface.

6. The method of claim 5, wherein forming protrusions comprises depositing and etching a layer on the wafer.

7. The method of claim 1, wherein forming trenches comprises forming trenches having a depth of between 10 μm and 300 μm.

8. A method of forming a semiconductor chip, the method comprising:

providing a silicon wafer having a wafer surface;

subjecting the silicon wafer to plasma etch; and deforming a contour of the plasma etch so that ions from the plasma etch are projected in a direction that is oblique to the wafer surface.

9. The method of claim 8, wherein deforming a contour of the plasma etch comprises providing protrusions on the wafer surface.

10. The method of claim 8, further comprising forming an oblique recess having a sectional dimension smaller than 10 μm with the ions from the plasma etch.

11. The method of claim 8, further comprising forming protrusions of a height greater than 100 μm on the wafer with the ions from the plasma etch.

12. The method of claim 8, further comprising forming recesses having a depth of from 10 μm to 300 μm with the ions from the plasma etch.

* * * * *